(12) United States Patent
Hamada et al.

(10) Patent No.: US 7,934,944 B2
(45) Date of Patent: May 3, 2011

(54) ELECTRICAL CONNECTING APPARATUS

(75) Inventors: Kazuhito Hamada, Aomori (JP);
Takashi Akiniwa, Aomori (JP); Satoshi Narita, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 12/296,430

(22) PCT Filed: Mar. 22, 2007

(86) PCT No.: PCT/JP2007/056751
§ 371 (c)(1),
(2), (4) Date: Oct. 7, 2008

(87) PCT Pub. No.: WO2007/116795
PCT Pub. Date: Oct. 18, 2007

(65) Prior Publication Data
US 2010/0029099 A1 Feb. 4, 2010

(30) Foreign Application Priority Data
Apr. 7, 2006 (JP) .................................. 2006-105924

(51) Int. Cl.
*H01R 11/18* (2006.01)
(52) U.S. Cl. .................. 439/482; 324/758; 324/754
(58) Field of Classification Search .................. 439/482; 324/758, 754, 756, 762
See application file for complete search history.

(56) References Cited

U.S. PATENT DOCUMENTS

| | | | |
|---|---|---|---|
| 4,081,601 A | 3/1978 | Dinella et al. | |
| 5,136,470 A | 8/1992 | Sheridon et al. | |
| 5,264,787 A | * 11/1993 | Woith et al. | 324/758 |
| 5,461,326 A | * 10/1995 | Woith et al. | 324/758 |
| 5,468,917 A | 11/1995 | Brodsky et al. | |
| 5,623,213 A | 4/1997 | Liu et al. | |

(Continued)

FOREIGN PATENT DOCUMENTS

JP 08-327658 12/1996

(Continued)

OTHER PUBLICATIONS

International Search Report for International Patent Application Serial No. PCT/JP2007/065787; Japanese Patent Office, Oct. 30, 2007.

(Continued)

*Primary Examiner* — Xuong M Chung Trans
(74) *Attorney, Agent, or Firm* — Bryan A. Santarelli; Graybeal Jackson LLP

(57) ABSTRACT

An embodiment of an electrical connecting apparatus comprises a support board having an upper surface and a lower surface, a block having an attachment surface directing downward and attached to the support board in a state where at least the attachment surface is located below the support board, a flexible circuit board having a contactor area in which a plurality of contactors are arranged and an outside area around the contactor area and attached at part of the outside area to the lower surface of the support board in a state where at least the contactor area is opposed to the attachment surface of the block, and a reference mark member having a lower end surface and a reference mark for positioning provided on the lower end surface and attached to the block in a state where the lower end surface is exposed to the lower side of the circuit board. Accordingly, the measurement accuracy of the probe tip position is heightened.

9 Claims, 13 Drawing Sheets

U.S. PATENT DOCUMENTS

| | | |
|---|---|---|
| 5,703,331 A | 12/1997 | Brodsky et al. |
| 5,729,896 A | 3/1998 | Dalal et al. |
| 6,041,495 A | 3/2000 | Yoon et al. |
| 6,122,815 A | 9/2000 | Kownacki et al. |
| 6,906,414 B2 | 6/2005 | Zhao et al. |
| 7,167,373 B1 | 1/2007 | Hoang et al. |
| 7,323,093 B2 | 1/2008 | Naito et al. |
| 7,342,402 B2 * | 3/2008 | Kim et al. .................. 324/758 |
| 7,416,759 B2 | 8/2008 | Shintate et al. |
| 7,471,095 B2 * | 12/2008 | Narita et al. ................. 324/754 |
| 7,487,587 B2 | 2/2009 | Vanfleteren et al. |
| 2001/0013423 A1 | 8/2001 | Dalal et al. |
| 2002/0001056 A1 | 1/2002 | Sandberg et al. |
| 2004/0212051 A1 | 10/2004 | Zhao et al. |
| 2006/0231288 A1 | 10/2006 | Vanfleteren et al. |

FOREIGN PATENT DOCUMENTS

| | | |
|---|---|---|
| JP | 10-505162 | 5/1998 |
| JP | 11-044708 | 2/1999 |
| JP | 2000-150594 | 5/2000 |
| JP | 2001-147240 | 5/2001 |
| JP | 2002-509604 | 3/2002 |
| JP | 2002-311049 | 10/2002 |
| JP | 2002-340932 | 11/2002 |
| JP | 2002-365310 | 12/2002 |
| JP | 2003-043064 | 2/2003 |
| JP | 2003-121469 | 4/2003 |
| JP | 2003-227849 | 8/2003 |
| JP | 2005-038983 | 2/2005 |
| WO | 9607924 | 3/1996 |
| WO | 9743653 | 11/1997 |
| WO | 2007119636 | 10/2007 |
| WO | 2007119637 | 10/2007 |
| WO | 2007119638 | 10/2007 |
| WO | 2008038468 | 4/2008 |

OTHER PUBLICATIONS

International Search Report for International Patent Application Serial No. PCT/JP2007/056751; Japanese Patent Office, Jun. 26, 2007.

International Search Report for International Patent Application Serial No. PCT/JP2007/057358; Japanese Patent Office, Jun. 12, 2007.

International Search Report for International Patent Application Serial No. PCT/JP2007/057359; Japanese Patent Office, Jun. 26, 2007.

International Search Report for International Patent Application Serial No. PCT/JP2007/057362; Japanese Patent Office, Jun. 12, 2007.

* cited by examiner

ELECTRICAL CONNECTING APPARATUS

PRIORITY CLAIM

The present application is a national phase application filed pursuant to 35 USC §371 of International Patent Application Serial No. PCT/JP2007/056751, filed Mar. 22, 2007; which further claims the benefit of Japanese Patent Application 2006-105924, filed Apr. 7, 2006; all of the foregoing applications are incorporated herein by reference in their entireties.

CROSS REFERENCE TO RELATED APPLICATIONS

This application is related to U.S. application Ser. No. 12/297,214 entitled FLEXIBLE WIRING BOARD AND ELECTRICAL CONNECTING APPARATUS, filed Oct. 14, 2008 and application Ser. No. 12/297,215 entitled PROBE SHEET AND ELECTRICAL CONNECTING APPARATUS, filed Oct. 14, 2008 and application Ser. No. 12/297,216 entitled METHOD FOR MANUFACTURING PROBE SHEET, filed Oct. 14, 2008, and U.S. application Ser. No. 12/443,462 entitled ELECTRICAL CONNECTING APPARATUS, filed Mar. 27, 2009.

TECHNICAL FIELD

An embodiment of the present invention relates to an electrical connecting apparatus for use in an electrical test of a flat-plate-shaped device under test such as an integrated circuit or a display board.

BACKGROUND

A flat-plate-shaped device under test such as an integrated circuit or a display board undergoes an electrical test with use of an electrical connecting apparatus such as a probe card. In the electrical test, the device under test with its electrodes contacting the contactors of the electrical connecting apparatus and is powered in that state.

As one of the electrical connecting apparatuses of this kind, there is an art of using a flexible circuit board having a flexible sheet-like member such as an FPC provided with a flexible electrical insulating sheet and a plurality of wires formed on the sheet, and contactors soldered to the respective wires of this sheet-like member.

Referring to: Japanese Patent Appln Public Disclosure No 2002-311049, which is incorporated by reference, each contactor comprises a pedestal portion coupled with the wire at one end portion, an arm portion extending from the other end of the pedestal portion in the longitudinal direction of the wire, and a probe tip portion protruded from the tip end of the arm portion to a side opposite the pedestal portion. The arm portion and the probe tip portion act as a main body portion that is elastically deformed substantially at the arm portion when the tip end of the probe tip portion, that is, the probe tip, is thrust to an electrode of a device under test.

The circuit board using such contactors is attached to a support board such as a wiring board by an attachment apparatus so that the probe tip portions can be directed to the device under test, thus to be assembled into an electrical connecting apparatus.

The attachment apparatus comprises a first reinforcing plate (plate-shaped member) arranged on the upper surface of the wiring board, a ring-shaped second reinforcing plate (ring-shaped member) arranged in a downward step portion provided at the center of the wiring board so as to be located at the step portion, a plate spring screwed on the lower side of the second reinforcing plate, and a table (block) having at least an attachment surface on the lower side and screwed on the lower side of the plate spring in a state where the attachment surface is protruded downward of the support board.

The first reinforcing plate is attached to the wiring board by a plurality of attachment screws penetrating the first reinforcing plate and the wiring board in the up-down direction and screwed in the second reinforcing plate and attaches the second reinforcing plate to the wiring board.

The aforementioned circuit board is bonded to the attachment surface of the table at a contactor area at which the contactors are arranged and is attached to the lower surface of the wiring board by a ring-shaped pressing plate and a plurality of locking screws at an outermost circumferential portion of an outer area surrounding this contactor area.

The above electrical connecting apparatus undergoes positioning (that is, alignment) in which the probe tips of the contactors are positioned relative to the coordinates of a testing apparatus such as a prober in a state of being attached to the testing apparatus. Thereafter, the electrical connecting apparatus is powered at an appropriate contactor in a state where the probe tip is thrust against the electrode of the device under test. By doing so, an electrical test is conducted.

The above positioning is performed generally by measuring the position of the probe tip of the appropriate contactor relative to the coordinates of the testing apparatus and thereafter changing the coordinates on the software of the testing apparatus or correcting the attachment position of the electrical connecting apparatus to the testing apparatus so that the measured position may be at an intended position on the coordinates of the testing apparatus. Such positioning is performed every time the electrical connecting apparatus is replaced.

Generally, as for the above electrical connecting apparatus, a check as to whether or not the powering state is good is performed on the side of a manufacturer of the electrical connecting apparatus before the electrical connecting apparatus is delivered from the manufacturer to the user. This check is performed by powering all the probes simultaneously or sequentially, or per plural probes in a state where the probe tips of all the contactors are thrust against a pseudo test piece.

Accordingly, in the conventional electrical connecting apparatus, even if the probe tip portion is cleaned after the check, foreign matters such as scrapes generated at the time of the check inevitably remain at the probe tip. Consequently, at the time of positioning on the user side, the foreign matters remaining at the probe tip lowers the measurement accuracy of the probe tip position, and accurate positioning is difficult.

Also, the above probe tip position is generally determined by directing light beam such as laser beam toward the probe tip and measuring reflected light from the probe tip by a measuring instrument or by capturing the probe tip by a video camera and performing electrical image processing to the output signals from the video camera.

However, since light from the vicinity of the probe tip is also incident in the video camera, it is difficult to electrically distinguish between light signals from the probe tip and light signals from the vicinity of the probe tip. Thus, this also lowers the measurement accuracy of the probe tip position, and accurate positioning is difficult.

SUMMARY

An embodiment of the present invention heightens the measurement accuracy of a probe tip position.

An electrical connecting apparatus according to an embodiment of the present invention comprises a support board having an upper surface and a lower surface, a block having an attachment surface directing downward and attached to the support board in a state where at least the attachment surface is located further to a lower side than the support board, a flexible circuit board having a contactor area in which a plurality of contactors are arranged and an outside area around the contactor area and attached at part of the outside area to the lower surface of the support board in a state where at least the contactor area is opposed to the attachment surface of the block, and a reference mark member having a lower end surface and a reference mark for positioning provided on the lower end surface and attached to the block in a state where the lower end surface is exposed to the lower side of the circuit board.

According to an embodiment, the position of the reference mark is measured for positioning of the probe tips of the contactors against a testing apparatus. At the time of this measurement, since the reference mark is formed on the lower end surface of the reference mark member other than the contactors, the reference mark may have different optical characteristics from those of the periphery such as a cross, a point, etc. Thus, the probe tip positions can be measured highly accurately regardless of whether or not foreign matters remain on the probe tips and without being influenced by optical characteristics in the vicinity of the mark.

At least the lower end portion of the reference mark member may penetrate the circuit board. By doing so, since the reference mark is exposed to the lower side of the circuit board, measurement of the reference mark can be performed more reliably.

The circuit board may have a plurality of wires extending from the contactor area outward in the radial direction. By doing so, the interval of the wires adjacent to each other in the circumferential direction can be wider at a position further outside in the radial direction. Thus, the position that the reference mark member penetrates can be a position outside the contactor area of the circuit board, in which the positioning mark member does not influence the wires of the circuit board, that is, a position where the interval between the wires adjacent to each other in the circumferential direction is wide.

At least a pair of the reference mark members whose lower end surfaces are distanced with the contactor area of the circuit board in between may be included. Thus, by measuring the reference marks of both the reference mark members, the two-dimensional positions of the contactors on the coordinates in the testing apparatus can be measured accurately.

The reference mark member may include a pin member. Also, each pin member may be attached to the block at the upper portion and may be protruded to the lower side of the circuit board at the lower end portion.

The outside area of the circuit board may have an intermediate area around the contactor area and a plurality of extending portions extending from the intermediate area in the radial direction to be spaced around the intermediate area, the block may have a truncated polygonal pyramidal downward surface formed by the attachment surface, an intermediate surface continuing into the perimeter of the attachment surface, and slopes continuing into the perimeter of the intermediate surface, the contactor area may be opposed to the attachment surface, the intermediate area may be opposed to a surface area around the attachment surface, at least parts of the extending portions may be opposed to the slopes, and each reference mark member may be protruded downward from the slope of the block and penetrate the extending portion of the circuit board. By doing so, since the lower end surface of the reference mark member is exposed downward from the extending portion extending in an inclined manner, light from the lower end surface of the reference mark member can be distinguished from light from the extending portion reliably.

The contactor area may be bonded to the attachment surface. By doing so, since the contactor area is supported on the block in a stable manner, the contactors are stable against the support board.

The lower end surface of the reference mark member may be set back further upward than the contactor area. By doing so, when the probe tips are thrust toward and against a device under test, the lower end surface of the positioning mark member can be located further upward than the contactors so that the positioning mark member does not contact the device under test.

Figure 1:
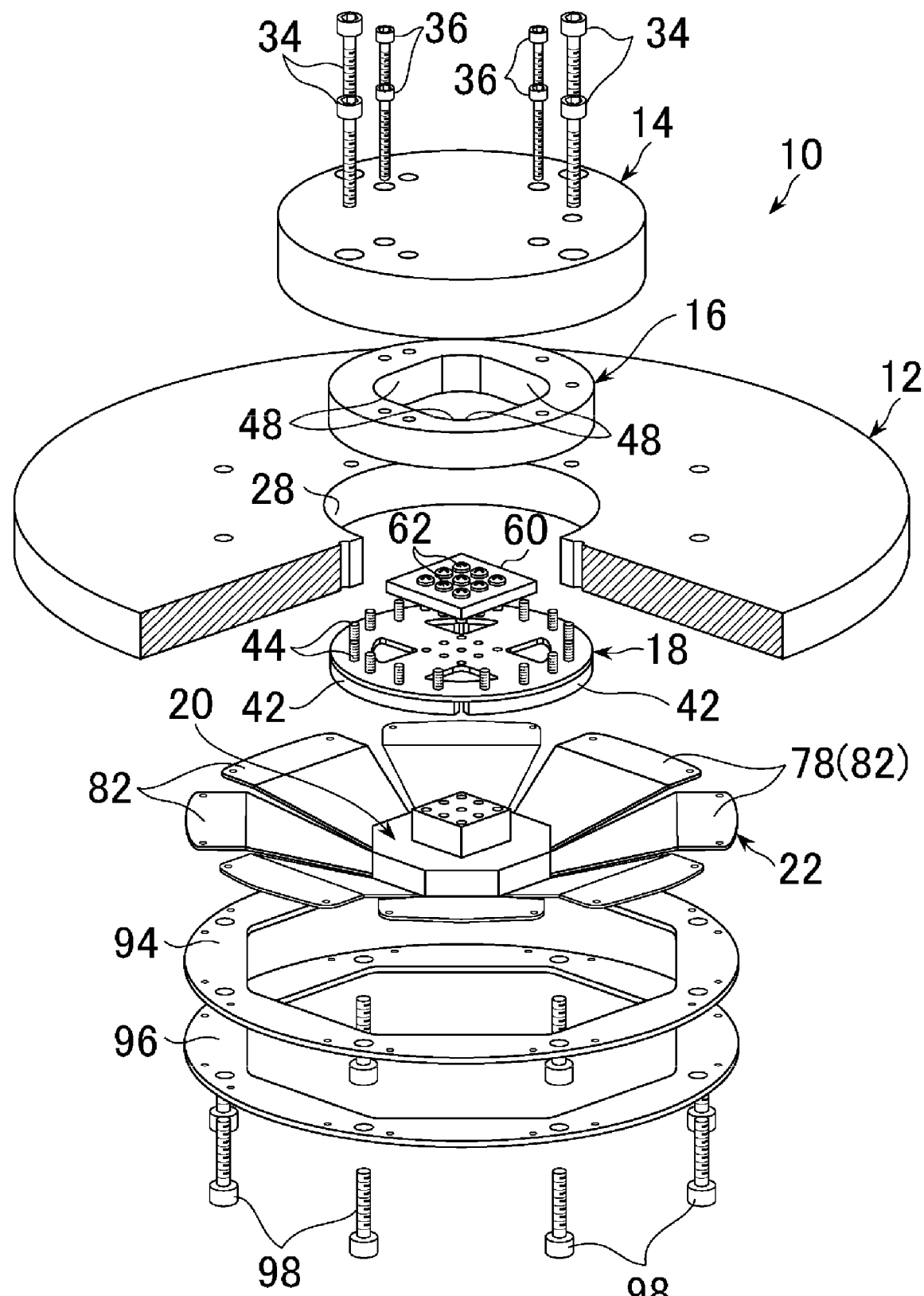
FIG. 1 is an exploded perspective view showing an embodiment of an electrical connecting apparatus according to the present invention.

DESCRIPTION OF THE SYMBOLS 10 electrical connecting apparatus
12 support board
14 plate-shaped member
16 ring-shaped member
18 plate spring
20 block
22 circuit board
24 reference mark member
26 adjustment screw
28 through hole
30 tester land
32 connection land
34 screw member
36 attachment screw
38 center area of the plate spring
39 extending area of the plate spring
40 circumferential area of the plate spring
42 spring holder
44 screw member 46, 48 flat areas
50 attachment surface of the block
51 intermediate surface of the block
52 slope of the block
54 lower block portion
56 attached surface of the block
58 upper block portion
60 attachment plate
62 screw member
64 recess of the block
66 groove of the block
70 sheet
70a, 70b, 70c sheet members
72 conductive path
74 contactor
76 contactor area of the circuit board
78 outside area of the circuit board
80 intermediate area of the circuit board
82 extending portion of the circuit board
84 connection bump
86 plate
88 pedestal portion of the contactor
88a, 88b first and second seat portions
90 main body portion of the contactor
90a arm portion
90b probe tip
92 adhesive
94 rubber ring
96 pressure ring
100 positioning pin
102 reference mark

DETAILED DESCRIPTION

In an embodiment of the present invention, in FIG. 1, the left-right direction is referred to as a left-right direction or an X direction, the front-back direction is referred to as a front-back direction or a Y direction, and the up-down direction is referred to as an up-down direction or a Z direction. However, these directions differ depending on the posture in which a device under test is arranged in a testing apparatus, that is, the posture of the device under test arranged in the testing apparatus.

Accordingly, as for the above directions, the X direction and the Y direction may be determined to be within any one plane of a horizontal plane, an inclined surface inclined to the horizontal plane, and a vertical plane vertical to the horizontal plane or may be determined to be a combination of these planes in accordance with an actual testing apparatus.

An electrical connecting apparatus 10 is used in an electrical test of a rectangular integrated circuit (not shown) in a similar manner as a probe card. The integrated circuit has a plurality of electrodes. These electrodes are arrayed in two lines to be spaced in the left-right direction (or the front-back direction) in the example shown in FIG. 9.

Figure 2:
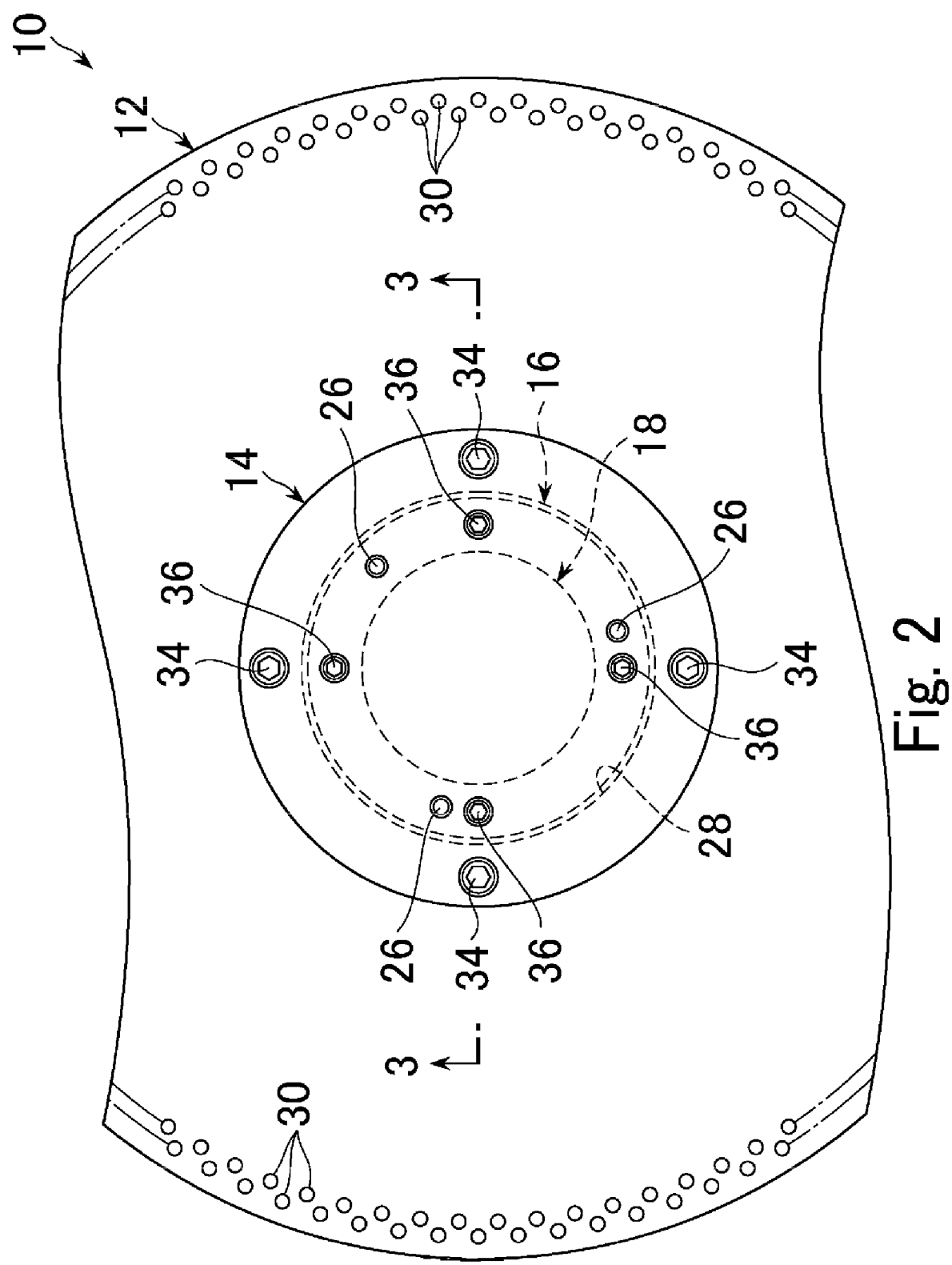
FIG. 2 is a plan view of the electrical connecting apparatus shown in FIG. 1.
Figure 3:
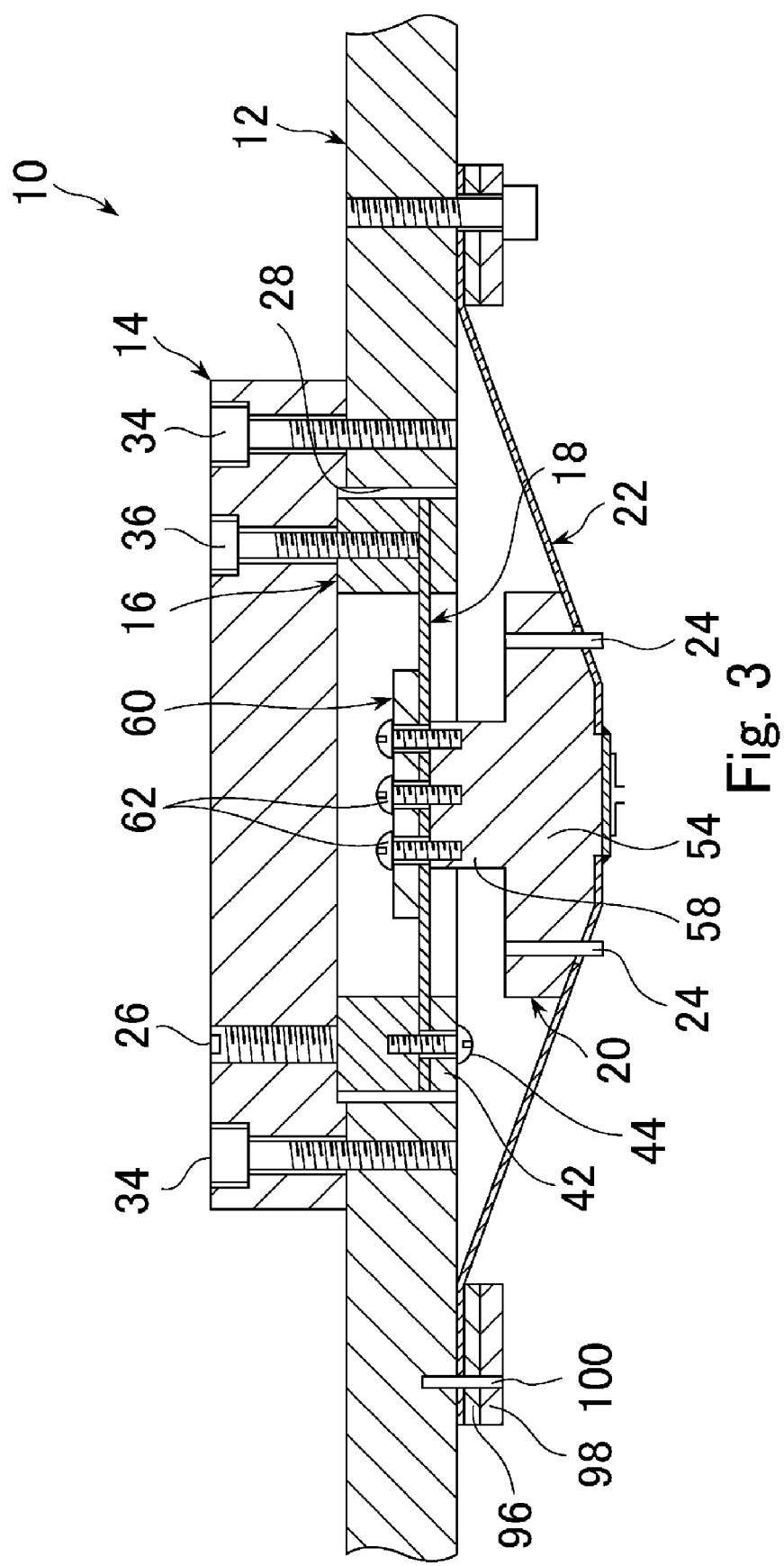
FIG. 3 is a cross-sectional view obtained along the line 3-3 in FIG. 2.
Figure 4:
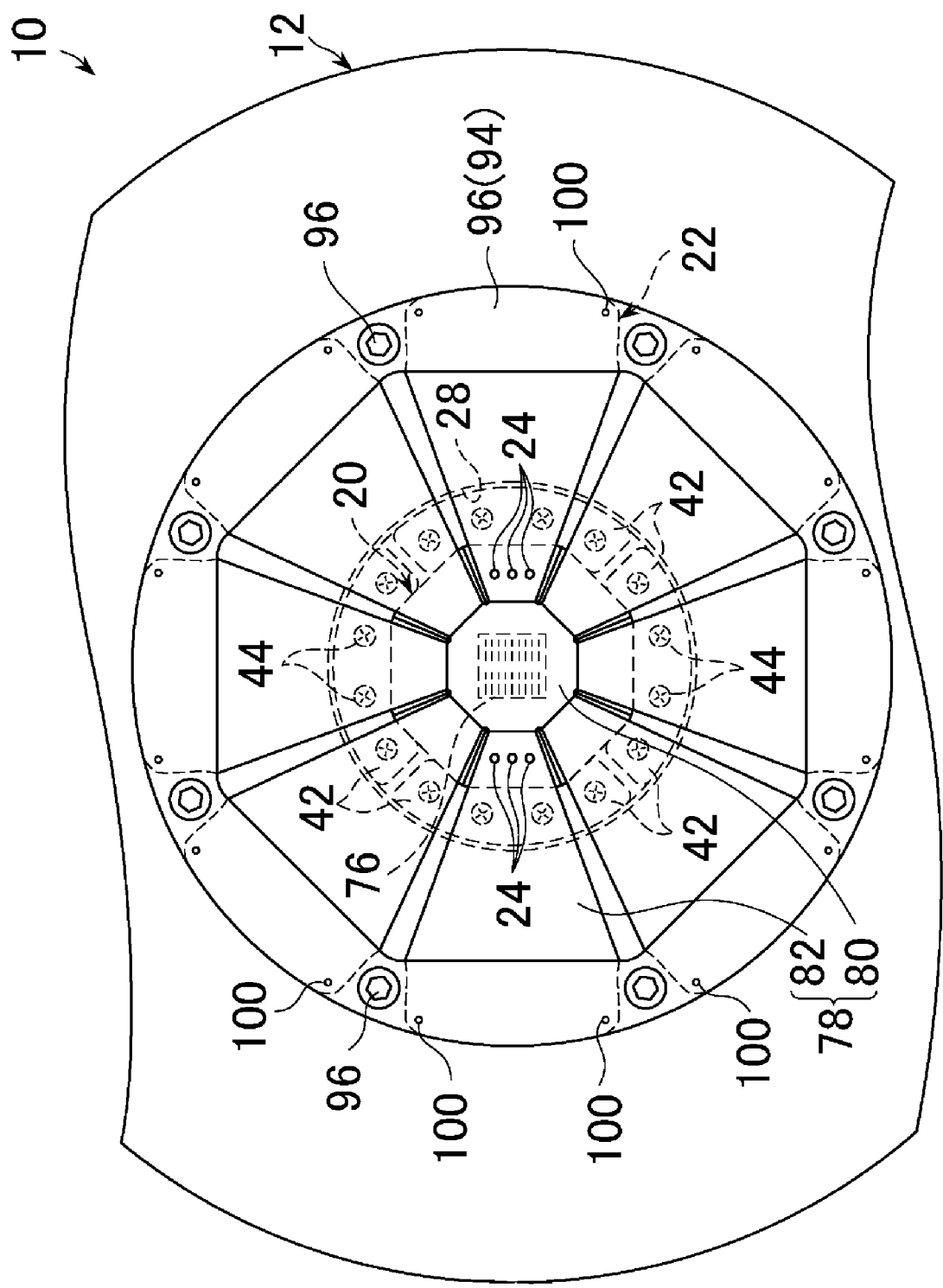
FIG. 4 is a bottom view of the electrical connecting apparatus shown in FIG. 1.
Figure 5:
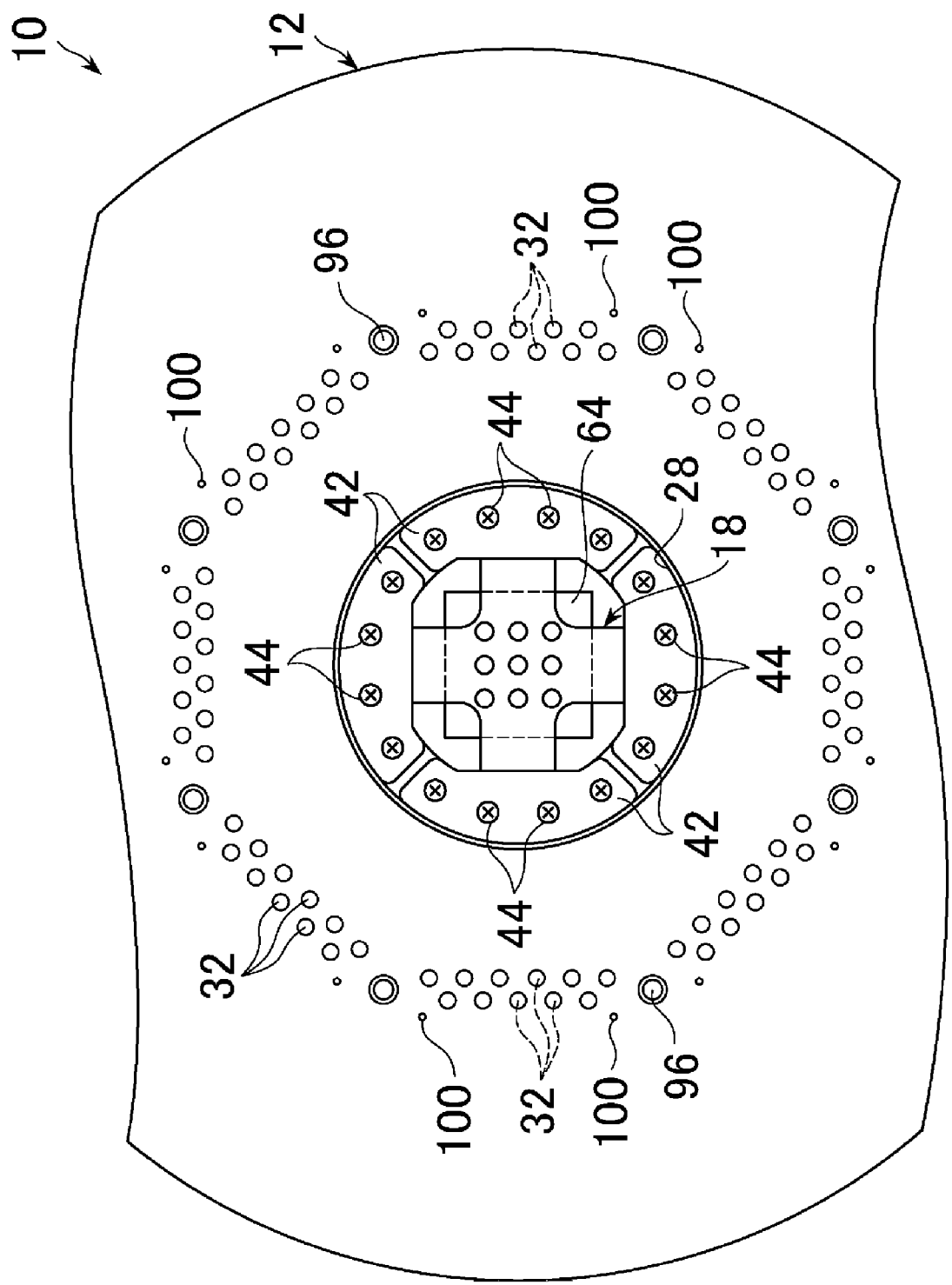
FIG. 5 is a bottom view of the electrical connecting apparatus shown in FIG. 1 in a state where a circuit board and pressure plates have been removed.

Referring to FIGS. 1 to 13, the electrical connecting apparatus 10 includes a disk-shaped support board 12, a plate-shaped member 14 attached to the upper surface of the support board 12, a plate-shaped ring-shaped member 16 arranged on the lower side of the plate-shaped member 14, a plate spring 18 arranged on the lower side of the ring-shaped member 16, a table or a block 20 attached to the lower surface of the plate spring 18, a film-shaped board or a circuit board 22 arranged on the lower side of the block 20, a plurality of reference mark members 24 attached to the block 20, and a plurality of adjustment screws 26 (refer to FIGS. 2 and 3) penetrating the plate-shaped member 14 in its thickness direction and abutting to the aforementioned ring-shaped member 16.

The support board 12 has a through hole 28 passing through its center in the thickness direction (up-down direction), has a plurality of tester lands 30 (refer to FIG. 2) connected to a tester at the circumferential portion on the upper surface, and has a plurality of connection lands 32 (refer to FIGS. 5 and 13) on the lower surface in an area between the through hole 28 and the circumferential portion to be spaced in the circumferential direction. The through hole 28 has a circular flat surface shape.

The support board 12 also has inside a plurality of wires (conductive paths) respectively connecting the tester lands 30 and the connection lands 32 in one-to-one relationship. Such a support board 12 may be a wiring board made of epoxy resin containing glass or a ceramic material.

The plate-shaped member 14 is formed in a larger disk shape than the through hole 28 and is attached to the upper surface of the support board 12 by a plurality of screw members 34 penetrating the plate-shaped member 14 and screwed in the support board 12 in a state of closing the through hole 28, that is, in parallel with the support board 12.

The plate-shaped member 14 is made of a metal material such as stainless steel so as to act as a reinforcing plate for the support board 12. Thus, the plate-shaped member 14 does not need to be a complete plate, but may be one formed in a plate shape consisting of a flat center portion, a plurality of extending portions extending from this center portion in the radial direction of a virtual circle to be spaced in the circumferential direction of the virtual circle, and an outer portion connected to the tip ends of these extending portions and extending in the circumferential direction of the virtual circle, as the plate spring 18 described later.

Figure 6:
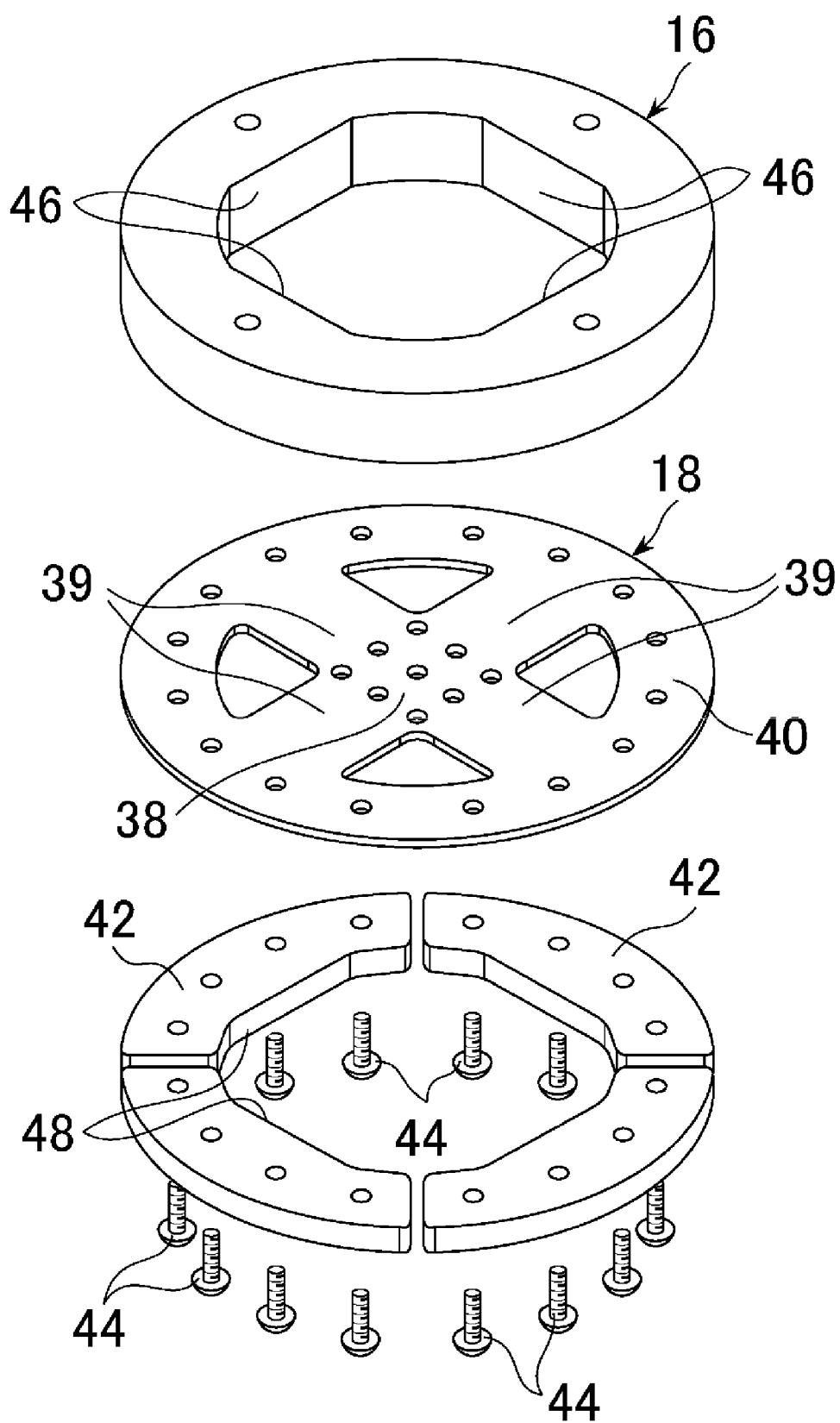
FIG. 6 is an exploded perspective view showing an embodiment of a ring-shaped member, a plate spring, and spring holders.

As shown in FIG. 6, the ring-shaped member 16 is also formed in a plate-shaped ring shape made of a metal material such as stainless steel, especially a metal material having a small thermal expansion coefficient, and having a slightly smaller outer dimension than the diameter dimension of the through hole 28, and is located in the through hole of the support board 12.

The ring-shaped member 16 is attached to the lower surface of the plate-shaped member 14 in parallel with the support board 12 and the plate-shaped member 14 by a plurality of attachment screws 36 penetrating the plate-shaped member 14 in its thickness direction and screwed in the ring-shaped member 16.

As shown in FIG. 6, the plate spring 18 has a flat center area 38, a plurality of plate-shaped extending areas 39 extending from the center area 38 in the radial direction of a virtual circle to be spaced in the circumferential direction of the virtual circle, and a ring-shaped circumferential area 40 integrally continuing around the extending areas 39.

The center area 38 and the plate-shaped extending areas 39 are formed in a star (*) shape. The number of the rim areas 39 may be an appropriate value such as four, six, eight, or the like. In the example shown in the figures, the number of the extending areas 39 is four, and thus the center area 38 and the extending areas 39 form a cross shape crossing at the center area 38.

The plate spring 18 may be made of a material selected from a group including tungsten, molybdenum, their alloy, and a ceramic material, having a smaller thermal expansion coefficient than that of stainless steel.

The thickness dimension of the plate spring 18 may be approximately 0.1 mm to 0.25 mm. The stiffness of the plate spring itself may become too big when the thickness dimension of the plate spring 18 exceeds 0.1 mm, while the flexibility of the plate spring itself becomes too small when it is less than 0.25 mm. Thus, when the thickness dimension of the plate spring 18 is within the above range, the flexibility amount of the plate spring 18 by overdrive described later becomes an optimal value, and irregular flexibility of the plate spring 18 is prevented.

The plate spring 18 is attached to the circumferential area 40 to the lower surface of the ring-shaped member 16 in parallel with the support board 12 by a plurality of arc-shaped spring holders respectively formed in arc shapes and a plurality of screw members 44 penetrating the spring holders 42 from the lower side and screwed in the ring-shaped member 16

In the example shown in the figures, the spring holders 42 are combined with each other to form a similar ring at the circumferential area 40 of the plate spring 18. However, a single ring-shaped spring holder is also applicable.

As shown in FIG. 6, as for the internal circumferential surfaces of the ring-shaped member 16 and the spring holders 42, portions corresponding to the boundaries between the extending areas 39 and the circumferential area 40 of the plate spring 18 are respectively flat areas 46 and 48 extending in the tangential direction of the outer surface of the plate spring 18 and in the up-down direction.

Figure 7:
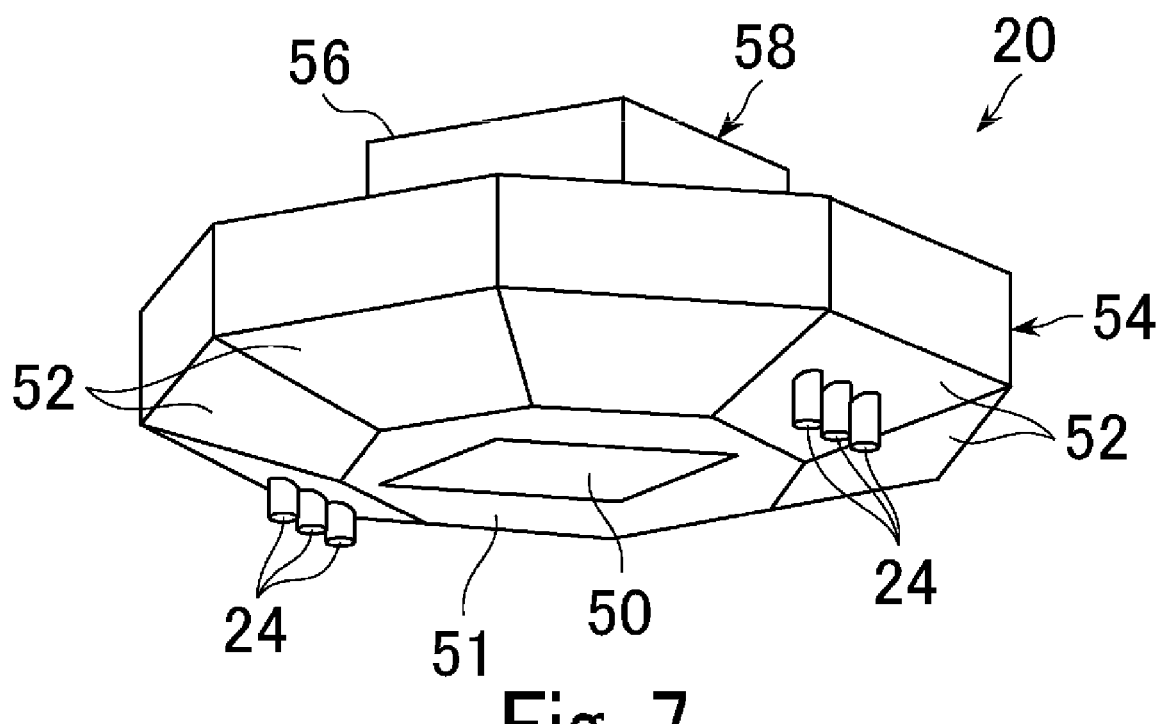
FIG. 7 is a perspective view showing an embodiment of a block.
Figure 8:
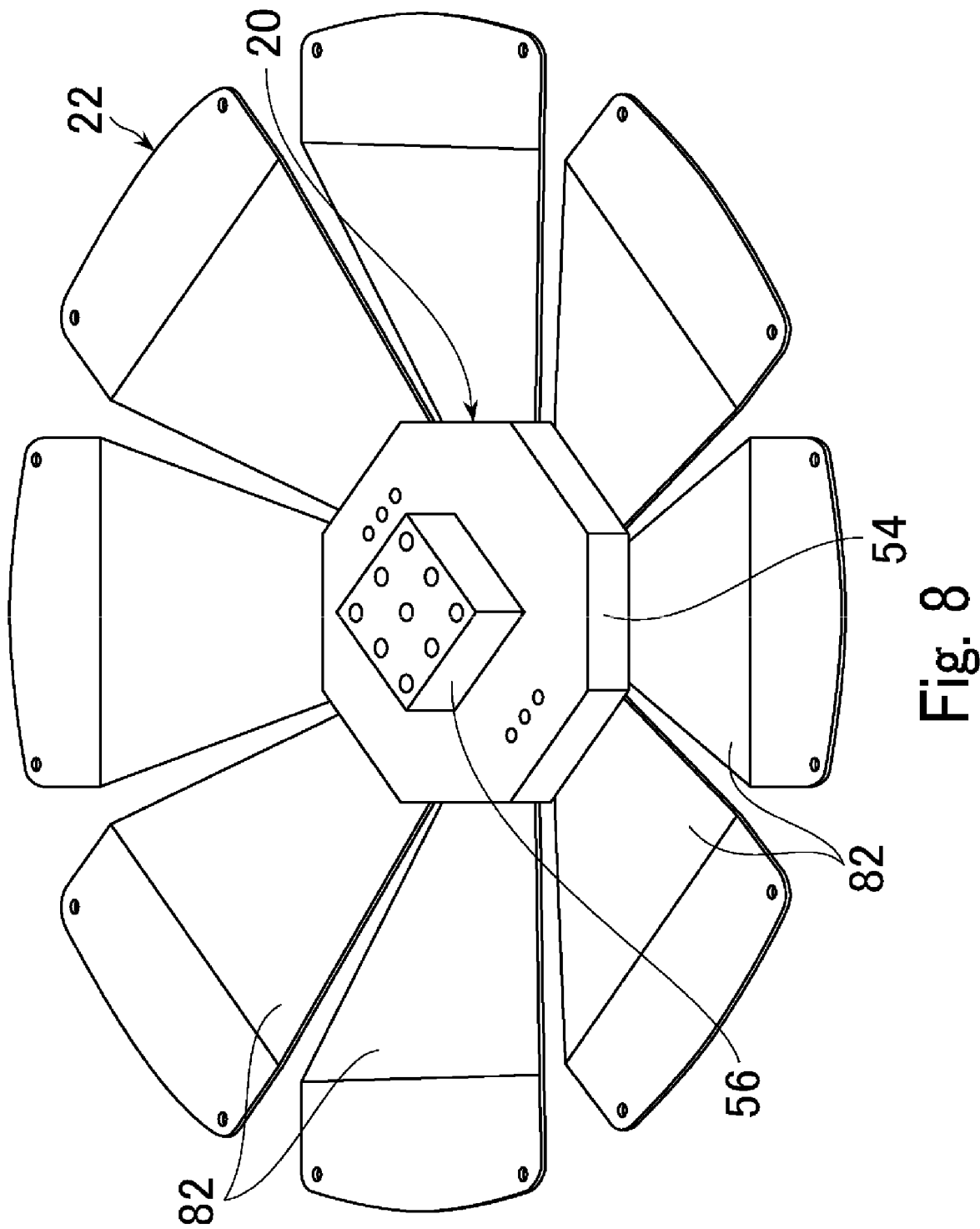
FIG. 8 is a perspective view showing a state where the circuit board has been attached to the block.

As shown in FIG. 7, the block 20 comprises a lower block portion 54 having a truncated polygonal pyramidal downward surface formed by an attachment surface 50 to which the circuit board 22 is to be attached, an intermediate surface 51 continuing into the perimeter of the attachment surface 50, and a plurality of slopes 52 continuing into the perimeter of the intermediate surface 51 and a prismatic upper block portion 58 whose upper end surface is an attached surface 56 to the plate spring 18

In the example shown in the figures, the attachment surface 50, the intermediate surface 51, and the attached surface 56 are parallel surfaces, and the downward surface of the lower block portion 54 is formed in a truncated octagonal pyramidal shape.

The block 20 is attached to the lower surface of the center area 38 of the plate spring 18 at the upper block portion 58 by a plurality of screw members 62 in a state where the center area 38 of the plate spring 18 is sandwiched between a rectangular attachment plate 60 (ref. to FIGS. 1 and 3) and the upper block portion 58 and in a state where the lower block portion 54 is protruded in the downward direction of the support board 12. The attachment surface 50 of the block 20 is in a rectangular shape similar to the shape of an integrated circuit to be tested.

Figure 11:
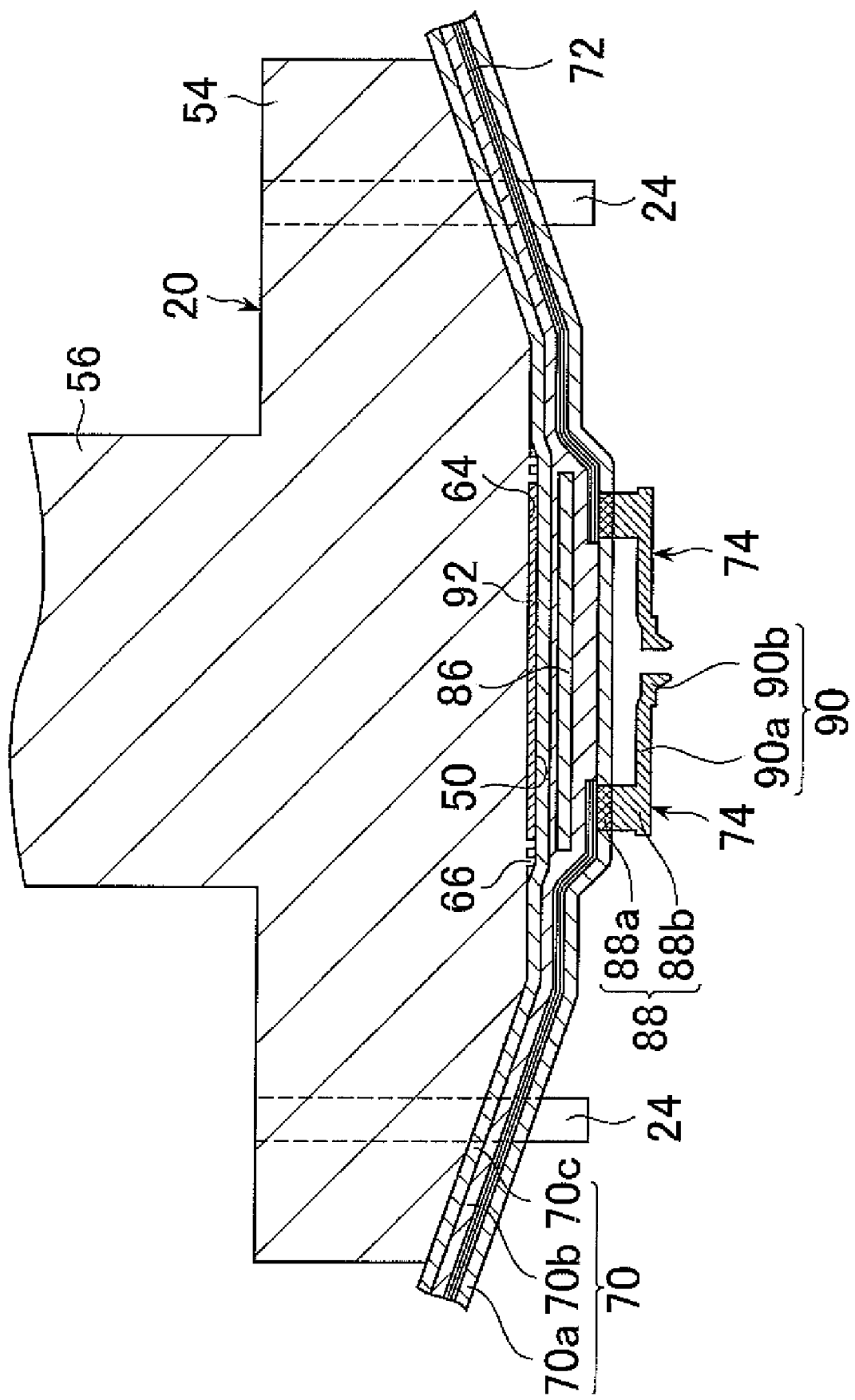
FIG. 11 is a cross-sectional view obtained along the line 11-11 in FIG. 9
Figure 12:
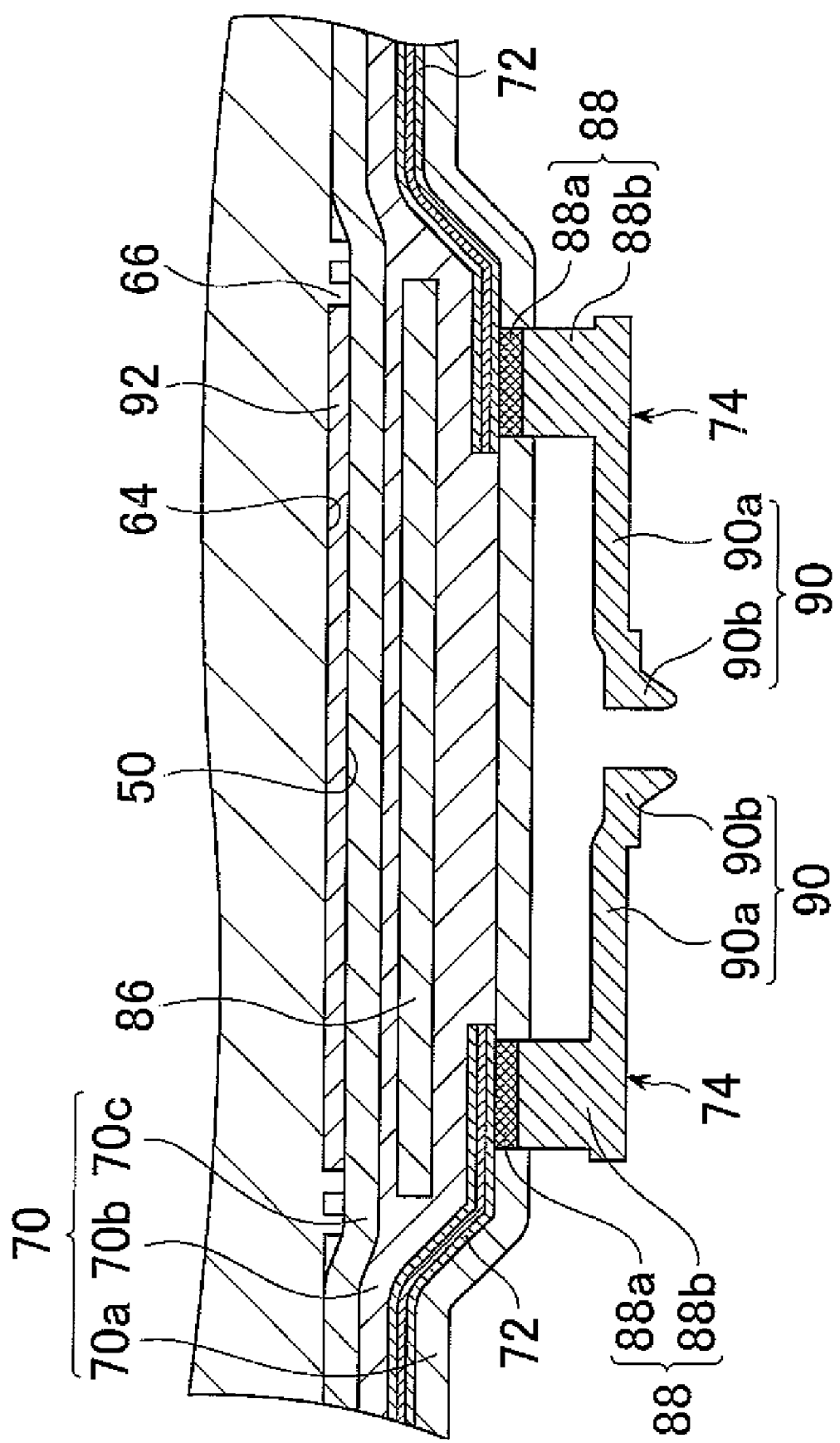
FIG. 12 is an enlarged cross-sectional view of the contactor area of the circuit board and its perimeter.

As shown in FIGS. 11 and 12, as for the lower end portion of the lower block portion 54, the attachment surface 50 is slightly protruded downward more than the intermediate surface 51 around it. At the lower end portion of the lower block portion 54 are formed a recess 64 opened at the attachment surface 50 and a downward groove 66 extending around the recess 64.

As shown in FIGS. 8 to 13, the circuit board 22 comprises an electrical insulating sheet 70 such as polyimide, a plurality of strip-like wires or conductive paths 72 formed inside the sheet 70, and a plurality of contactors 74, each contactor 74 being equipped with the conductive path 72. Thus, the circuit board 22 has flexibility. The sheet 70 is constituted by three sheet members 70a, 70b, and 70c.

The circuit board 22 has a rectangular contactor area 76 in which the contactors 74 are arranged and an outside area 78 around the contactor area 76. The outside area 78 comprises an intermediate area 80 integrally continuing into the perimeter of the contactor area 76 and a plurality of extending portions 82 extending from the intermediate area 80 in the radial direction of a virtual circle centering around the contactor area 76 to be spaced around the intermediate area 80.

Each conductive path 72 extends from the inside of the contactor area 76 in which the contactors 74 are arranged to the outside area 78 outward in the radial direction of the aforementioned virtual circle. At the outside end portion of each conductive path 72 are provided connection bumps 84 (refer to FIG. 13) penetrating the sheet members 70b, and 70c and protruded upward. In the example shown in the figures, each conductive path 72 is in a three-layered structure of copper, nickel, and copper.

As shown in FIGS. 11 and 12, a plate 86 is buried in a position corresponding to the contactor area 76 so as to maintain parallel accuracy of the contactor area 76. Accordingly, the contactor area 76 is protruded downward from the intermediate surface 51 as much as the sum of the thickness of the plate 86 and the amount of protrusion of the attachment surface 50 relative to the intermediate surface 51. The plate 86 is made of an appropriate material such as a ceramic plate, a stainless steel plate, or the like.

The sheet members 70a and 70b cooperatively sandwich the conductive paths 72 there between, and the sheet members 70b and 70c cooperatively envelop the plate 86 therein.

The above sheet 70, conductive paths 72, and plate 86 can be manufactured with use of a photolithographic technique, an electroplating technique, a resin application technique, an electroforming technique, etc. by forming a plurality of conductive paths 72 on one surface of the sheet member 70a, subsequently forming the sheet member 70b on a conductive paths 72 side of the sheet member 70a, arranging the plate 86 on a position of the sheet member 70b corresponding to the contactor area 76, and forming the sheet member 70c on the plate side of the sheet member 70b.

Each contactor 74 includes a pedestal portion 88 joined to a corresponding conductive path 72 and protruded in the downward direction of the sheet member 70a and a main body portion 90 integrally continuing into the lower end of the pedestal portion 88

The pedestal portion 88 comprises a first seat portion 88a made of a metal material of the same kind (e.g., copper) as that of the junction portion of the corresponding conductive path 72 and a second seat portion 88b joined to the lower end of the first seat portion 88a.

The first seat portion 88a is joined to the corresponding conductive path 72 at its rear end surface. The second seat portion 88b may be made of the same metal material (e.g., nickel) as that of the main body portion 90 integrally with the main body portion 90

The main body portion 90 comprises an arm portion 90a extending horizontally from the lower end of the second seat portion 88b and a probe tip 90b protruded downward from the tip end of the arm portion 90a.

The above contactor 74 may be manufactured with use of a photolithographic technique, an electroplating technique, an electroforming technique, etc. by sequentially forming the first seat portion 88a, the second seat portion 88b, the arm portion 90a, and the probe tip 90b in this order or reverse order.

After a part of the sheet member 70a is removed, the contactor 74 manufactured as above is joined to the corresponding conductive path 72 at the upper end surface of the first seat portion 88a by conductive adhesive. Thus, each contactor 74 is supported on the sheet 70 in a cantilevered manner in a state where the main body portion 90 is distanced downward from the sheet 70.

However, the sheet 70, the conductive paths 72, and the contactors 74 may be manufactured consecutively with use of a photolithographic technique, an electroplating technique, a resin application technique, an electroforming technique, etc. By doing so as well, each contactor is supported on the sheet 70 in a cantilevered manner.

In the above case, they may be manufactured in order of the probe tips 90b, the arm portions 90a, the second seat portions 88b, the sheet member 70a, the first seat portions 88a, the conductive paths 72, the sheet member 70b, and the sheet member 70c. The plate 86 only needs to be arranged on the sheet member 70b prior to formation of the sheet member 70c.

If the circuit board 22 is manufactured as above, the respective coupling strengths between the conductive path 72 and the first seat portion 88a, between the first seat portion 88a and the second seat portion 88b, between the second seat portion 88b and the arm portion 90a, and between the arm portion 90a and the probe tip 90b are increased.

Also, when the first seat portion 88a is made of the same metal material as the junction portion of the conductive path 72, and the second seat portion 88b is the same metal material as the main body portion 90, the coupling strengths between the first seat portion 88a and the conductive path 72 and between the second seat portion 88b and the main body portion 90 are further increased.

The junction surface between the first and second seat portions 88a and 88b is within the sheet member 70a as shown in FIG. 12. Accordingly, since the junction surface between both the seat portions 88a and 88b is closed in the sheet member 70a, even when a bending moment acts on the pedestal portion 88, separation of the first and second seat portions 88a and 88b caused by the bending moment is prevented.

As shown in FIGS. 11 and 12, the circuit board 22 is bonded to the attachment surface 50 at least contactor area 76 by adhesive 92 stored in the recess 64 in a state where the contactor area 76 and the intermediate area 80 are opposed to the attachment surface 50, and where part of each extending portion 82 is opposed to each slope 52.

The contactor area 76 and the intermediate area 80 around it are respectively thrust to the attachment surface 50 and the intermediate surface 51 around it at the time of being bonded to the block 20. Thus, since excessive adhesive in the recess 64 is pushed out to an area around the contactor area 76 (at least part of the intermediate area 80), the circuit board 22 is also bonded to an area around the attachment surface 50 (at least part of the intermediate surface 51) at the area around the contactor area 76 as well. As a result, the circuit board 22 is maintained in a state where the contactor area 76 is protruded further downward than a portion around it as shown in FIG. 12.

When the contactor area 76 and the area around it are bonded to the attachment surface 50 and the area around it as above, the contactor area 76 and the area around it are supported on the block 20 in a stable manner, and thus the contactors 74 are stable against the support board 12.

Figure 13:
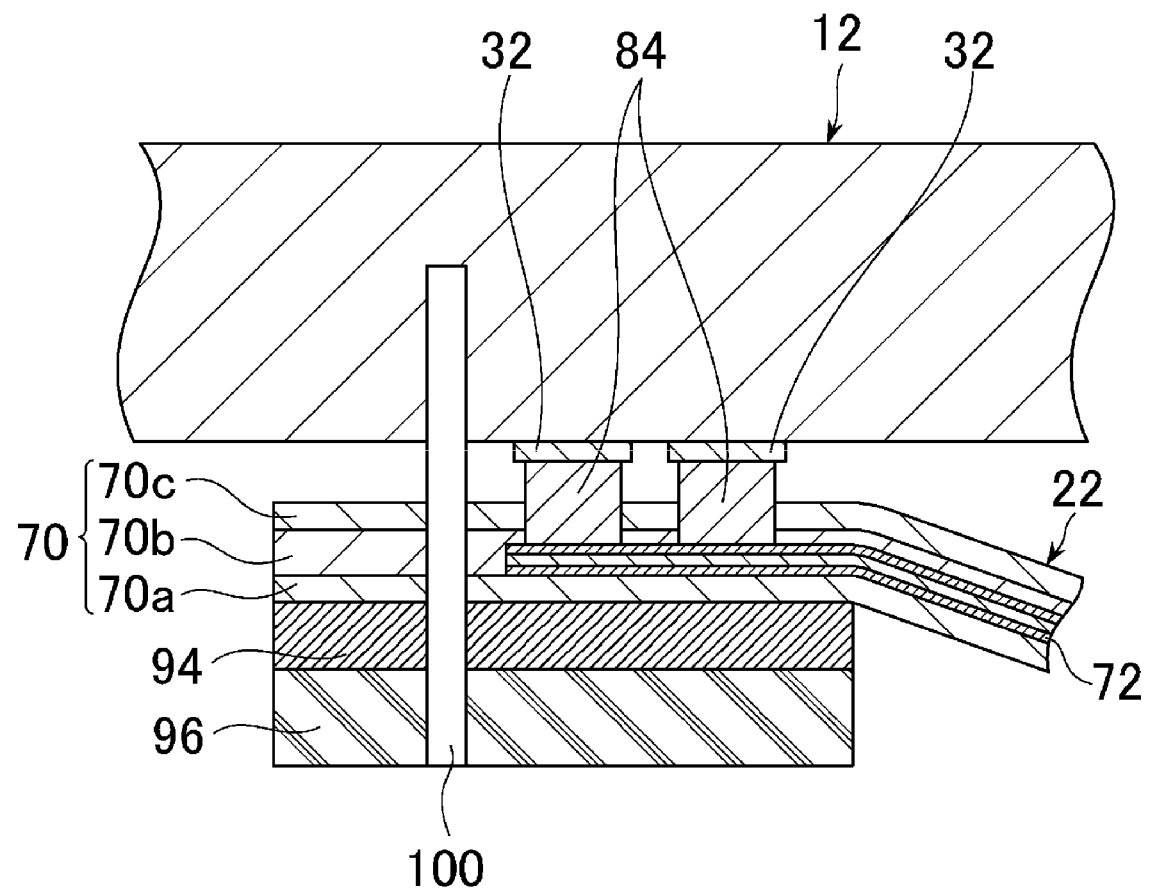
FIG. 13 is an enlarged cross-sectional view showing an attachment state of the circuit board to a support board.

The circuit board 22 is also attached to the lower surface of the support board 12 by an elastic plate-shaped rubber ring 94 such as a silicon rubber, a plate-shaped pressure ring 96 having certain hardness such as stainless steel, and a plurality of screw members 98 in a state where the connection bumps 84 are thrust to the connection lands 32 as shown in FIG. 13.

Positioning of the circuit board 22 relative to the support board 12 is performed by a plurality of positioning pins 100 (ref. to FIG. 3) extending downward from the support board 12 and penetrating the circuit board 22, the rubber ring 94, and the pressure ring 96 to be protruded downward. Each positioning pin 100 is held in the support board 12 in a stable manner.

In a state where the circuit board 22 is attached to the block 20 and the support board 12 as above, each contactor 74 is aligned so that its probe tip 90b is opposed to a corresponding electrode of a device under test and is electrically connected to the tester land 30 of the support board 12 via the conductive path 72, the connection bumps 84, the connection lands 32, the wires in the support board 12, etc.

Each reference mark member 24 is a pin member protruded downward from the slope 52 of the lower block portion 54 and is supported in the lower block portion 54 at its upper portion in a stable manner. In the example shown in the figures, three pairs of reference mark members 24 are provided. The reference mark members 24 of each pair are opposed to each other with the contactor area 76 and the intermediate area 80 in between.

The lower end surface of each reference mark member 24 is a surface parallel to the attachment surface 50, and the height position of the lower end surface of each reference mark member 24 is set back further upward than the height position of the contactors 74.

The lower portion of each reference mark member 24 is protruded downward of the circuit board 22 at the extending portion 82 of the circuit board 22, passing between the adjacent conductive paths 72. Since the interval of the adjacent conductive paths 72 at the extending portion 82 is wider than that at the intermediate area 80, the reference mark member 24 does not influence the formation position of the conductive paths 72.

Figure 9:
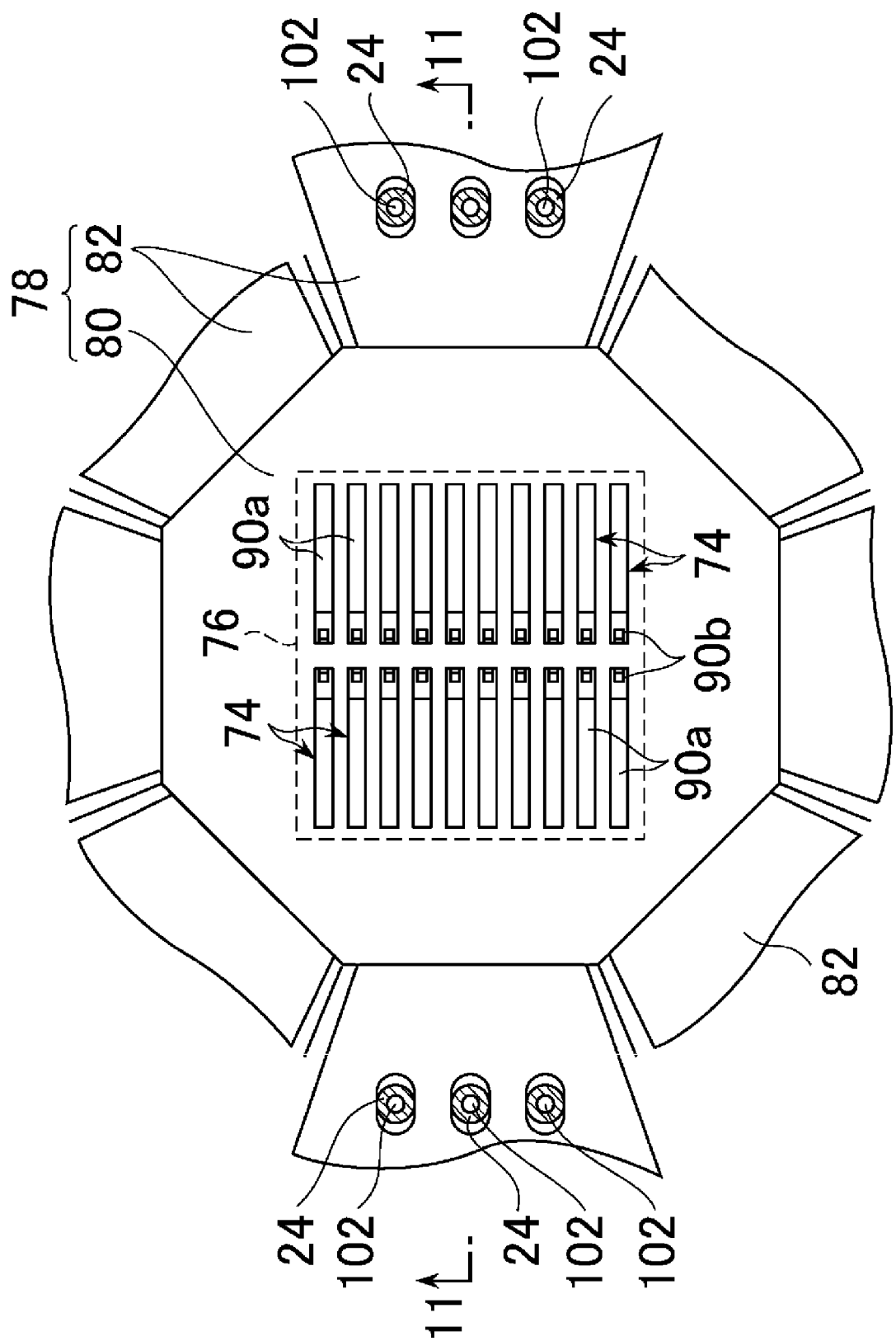
FIG. 9 is an enlarged bottom view of the contactor area of the circuit board and its perimeter.
Figure 10:
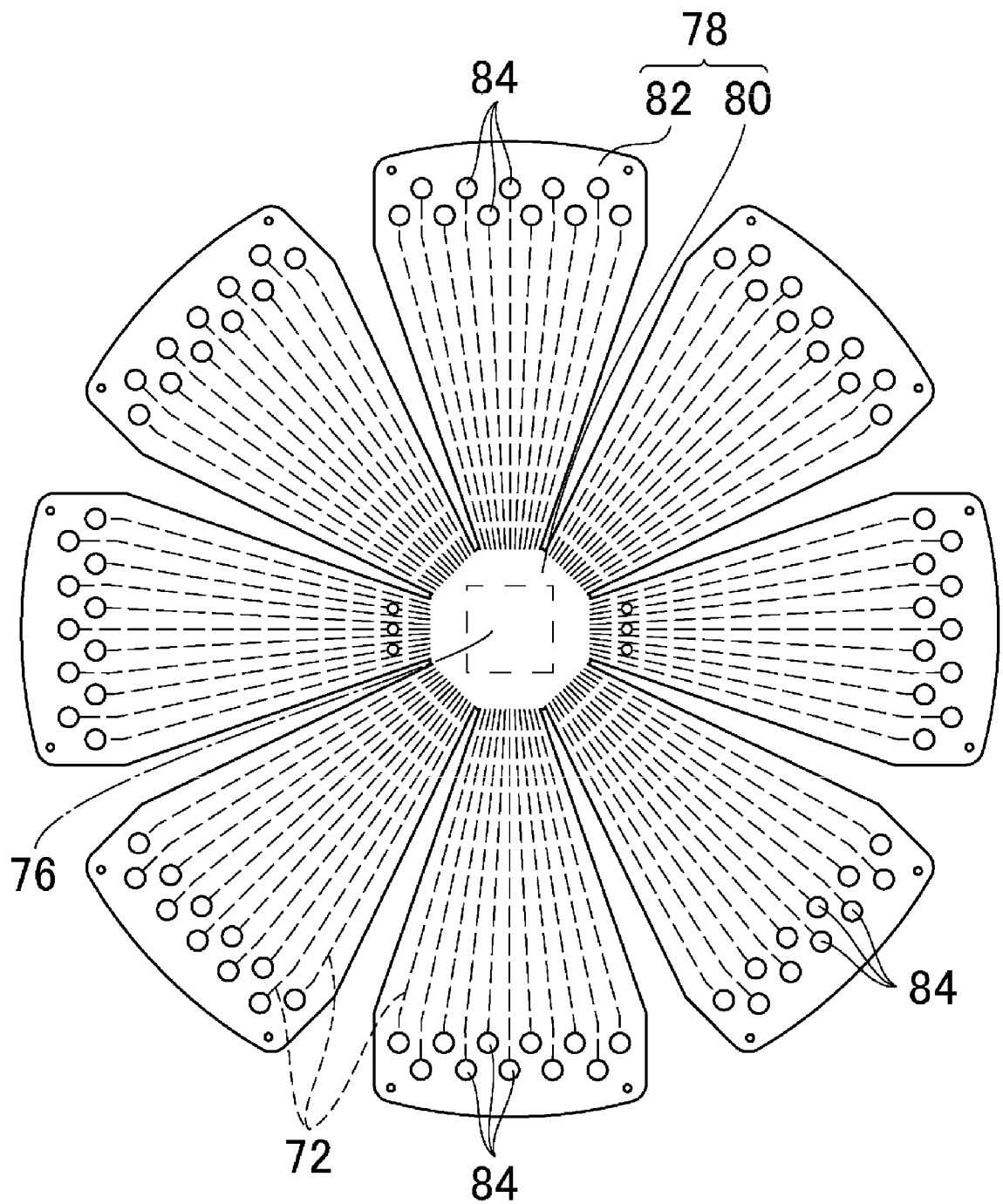
FIG. 10 is a plan view showing an embodiment of the circuit board.

As shown in FIG. 9, each reference mark member 24 has a reference mark 102 on the lower end surface. Each reference mark 102 cooperates with a reference mark 102 of an opposed reference mark member 24 with the contactor area 76 in between to represent the positions of the probe tips 90b located between both the reference marks 102 in the electrical connecting apparatus 10.

Each reference mark 102 has different optical characteristics from those of the periphery. Although the reference mark 102 is a round mark at the center in the example shown in the figures, it may be a dot, a crosshair intersection, etc.

Each reference mark 102 can be formed by forming a mark layer on the lower surface of the reference mark member 24 in advance by an appropriate technique such as electroplating or paint application, and after completion of the electrical connecting apparatus 10, by measuring the positions of the probe tips 90b, and removing by laser beam corresponding positions in the mark layer based on the measurement result. By doing so, the reference mark 102 can be formed accurately without depending on the assembling accuracy of the electrical connecting apparatus 10

The block 20, the reference mark members 24, the spring holders 42, the attachment plate 60, and the positioning pins 100 are made of appropriate materials, for example electrical insulating metal materials.

In a state where the electrical connecting apparatus 10 is assembled as above, parallel accuracy of the contactor area 76 relative to the support board 12 is adjusted.

This parallel accuracy adjustment may be performed by adjusting the screwing amount of the adjustment screws 26 in the plate-shaped member 14 so that the contactor area 76 may become parallel to the support board 12 in a state where the screwing amount of the attachment screws 36 in the ring-shaped member 16 is small and thereafter screwing the attachment screws 36 in the ring-shaped member 16 to reach a state where the adjustment screws 26 abut on the upper surface of the ring-shaped member 16. Accordingly, parallel accuracy of the contactor area 76 relative to the support board 12 may be adjusted easily.

Since the contactor area 76 is bonded to the attachment surface 50, it is reliably displaced together with the block 20 relative to the support board 12 at the time of the aforementioned parallel accuracy adjustment.

The electrical connecting apparatus 10 is incorporated in the testing apparatus in a state where the contactor area 76 is above the arrangement area of the device under test, and where the probe tip 90b of each contactor 74 is opposed to an electrode of the device under test, and the tester lands 30 of the support board 12 are connected to electrical circuits for an electrical test. In this manner, each contactor 74 is electrically connected to the electrical circuits for the electrical test.

In the electrical connecting apparatus 10, the reference marks 102 are measured for positioning of the probe tips 90b of the contactors 74 relative to the testing apparatus in a state where the electrical connecting apparatus 10 is mounted on the testing apparatus.

At the time of this measurement, since the reference marks 102 are formed on the lower end surfaces of the reference mark members 24 other than the contactors 74, the probe tip positions may be measured highly accurately and reliably regardless of whether or not foreign matters remain on the probe tips 90b and without being influenced by optical characteristics in the vicinity of the reference marks 102.

As for the reference marks 102, only the reference marks 102 of at least one pair of reference mark members 24 whose lower end surfaces are distanced with the contactor area 76 in between need to be measured. Accordingly, the two-dimensional positions of the contactors 74 on the coordinates in the testing apparatus may be measured accurately.

However, if the reference marks 102 of the three pairs of reference mark members 24 whose lower end surfaces are distanced with the contactor area 76 in between are measured, the two-dimensional positions of the contactors 74 on the coordinates in the testing apparatus may be measured more accurately.

At the time of the electrical test, the electrical connecting apparatus 10 and the device under test are moved relatively in directions in to approach each other. By doing so, the probe tip 90b of each contactor 74 is thrust to a corresponding electrode of the device under test, and an overdrive acts on the contactor 74.

When the probe tip 90b of each contactor 74 is thrust to the electrode of the device under test, the cantilevered contactor 74 is elastically deformed slightly in an arc shape at the arm portion 90a, and the plate spring 18 is elastically deformed due to the overdriving.

When the overdriving acts on the contactor 74, the electrical connecting apparatus 10 has the following technical merits.

Since the contactor area 76, the intermediate area 80, and part of each extending portion 82 of the circuit board 22 are opposed to the attachment surface 50, the intermediate surface 51, and a slope 52 of the block 20, respectively, and moreover the height position of the lower end surface of each reference mark member 24 is higher than the height position of the contactors 74, the reference mark member 24 does not contact the device under test when the probe tips 90b are thrust to the electrodes of the device under test.

When the contactors 74 are thrust to the electrodes, the plate spring 18 acts as a reaction force body for the center area of the circuit board 22, which is the arrangement area of the contactors 74. Consequently, the plate spring 18 is elastically deformed slightly by the circuit board 22 and the block 20 and allows the contactor area 76 to be displaced upward in parallel by the overdrive. This leads to a uniform pressure force of the contactors 74 to the electrodes.

The block 20 reliably transmits the deformation of the contactor area 76 of the circuit board 22 to the plate spring 18, and the through hole 28 allows the plate spring 18 to be elastically deformed easily to the ring-shaped member 16 side. This stabilizes the elastic deformation of the plate spring 18 and the circuit board 22 and facilitates contact of each contactor 74 with the electrode.

Irregular flexibility of the plate spring 18 when the overdrive acts on the contactors 74 is reliably prevented by the fact that the block 20 is attached to the star-shaped or cross-shaped intersection of the plate spring 18 and the fact that the inner peripheral surfaces of the ring-shaped member 16 and the spring holders 42 have the flat areas 46 and 48 extending in the tangential direction and in the up-down direction of the outer peripheral surface of the plate spring 18 at the respective portions corresponding to the boundaries between the extending area 39 and the circumferential area 40 of the plate spring 18, and the thrusting force of the contactors 74 to the electrodes is more uniform.

Since the coupling portion between both the seat portions 88a and 88b is located within the sheet 70, that is, the coupling portion is located within the thickness dimension of the sheet 70, part of the bending moment acting on the pedestal portion 88 is received in the sheet 70, and the coupling portion is protected by the sheet 70. As a result, separation of the contactor from the sheet 70 caused by the overdrive prevented while the coupling force between the conductive path 72 and the pedestal portion 88 is large.

The pedestal portion 88 distances the main body portion 90, particularly the tip end of the contactor 74, from the sheet 70 significantly. Accordingly, the overdrive makes it difficult for the main body portion 90 to contact the sheet 70, and for the sheet 70 to contact the device under test, as a result of which the contactor 74 reliably contacts the electrode of the device under test.

When the plate spring 18 made of a material having a smaller thermal expansion coefficient than that of stainless steel is used, thermal expansion and contraction of the plate spring 18 and displacement of the probe tip positions in reaction to heating or cooling of the device under test are small. Consequently, breakage of the probe tips and contact failure of the probe tips with the electrodes of the device under test may be prevented.

When the plate spring 18 has a thickness dimension of 0.1 mm to 0.25 mm, the flexibility amount of the plate spring 18 by the overdrive may be an optimal value, and irregular flexibility of the plate spring 18 is prevented more reliably.

When the plate spring 18 and the contactor 74 are designed so that the flexibility amount of the plate spring 18 when the overdrive acts on the contactor may become twice as much as that of the contactor 74, the flexibility amounts of the plate spring 18 and the contactor 74 by the overdrive may be optimal values, and irregular flexibility of the plate spring 18 or the contactor 74 may be prevented.

The present invention is not limited to the above embodiments but may be altered in various ways without departing from the spirit and scope of this description.

The invention claimed is:

1. An electrical connecting apparatus comprising:
    a support board having an upper surface and a lower surface;
    a block having an attachment surface directing downward and attached to said support board in a state where at least said attachment surface is located below said support board;
    a flexible circuit board having a contactor area in which a plurality of contactors are arranged on its lower surface thereof and an outside area around said contactor area and attached at part of said outside area to the lower surface of said support board in a state where at least said contactor area is opposed to said attachment surface of said block; and
    a reference mark member having a lower end surface and a reference mark for positioning provided on said lower end surface and attached to said block in a state where said lower end surface is exposed to the lower side of said circuit board.

2. The electrical connecting apparatus according to claim 1, wherein at least the lower end portion of said reference mark member penetrates said circuit board.

3. The electrical connecting apparatus according to claim 2, wherein said circuit board has a plurality of wires extending from said contactor area radially outward.

4. The electrical connecting apparatus according to claim 1, comprising at least a pair of said reference mark members whose said lower end surfaces are distanced with said contactor area of said circuit board in between.

5. The electrical connecting apparatus according to claim 1, wherein said reference mark member includes a pin member.

6. The electrical connecting apparatus according to claim 5, wherein said pin member is attached to said block at its upper portion and is protruded below said circuit board at the lower end portion.

7. The electrical connecting apparatus according to claim 1, wherein said outer peripheral area of said circuit board has an intermediate area around said contactor area and a plurality of extending portions extending from said intermediate area in the radial direction to be spaced around said intermediate area,
    wherein said block has a truncated polygonal pyramidal downward surface formed by said attachment surface, an intermediate surface continuing into the perimeter of said attachment surface, and slopes continuing into the perimeter of said intermediate surface,
    wherein said contactor area is opposed to said attachment surface, said intermediate area is opposed to a surface area around said attachment surface, and at least parts of said extending portions are opposed to said slopes, and
    wherein said reference mark member is protruded downward from said slope of said block and penetrates said extending portion of said circuit board.

8. The electrical connecting apparatus according to claim 1, wherein said contactor area is bonded to said attachment surface.

9. The electrical connecting apparatus according to claim 1, wherein the lower end surface of said reference mark member is set back further upward than said contactor area.

* * * * *